United States Patent [19]
Kim

[11] Patent Number: 5,946,494
[45] Date of Patent: Aug. 31, 1999

[54] METHOD FOR MINIMIZING THE NUMBER OF INPUT TERMINALS USED IN AN OPERATOR

[75] Inventor: Young-No Kim, Seoul, Rep. of Korea

[73] Assignee: LG Semicon Co., Ltd., Choongcheongbuk-Do, Rep. of Korea

[21] Appl. No.: 08/903,990

[22] Filed: Jul. 31, 1997

[30] Foreign Application Priority Data

Aug. 2, 1996 [KR] Rep. of Korea ............... 96/32330

[51] Int. Cl.[6] .................................................. G06F 9/45
[52] U.S. Cl. ................. 395/709; 395/705; 395/704; 209/580
[58] Field of Search ................... 395/708, 709, 395/705, 763, 790; 364/146, 188; 209/580; 356/326

[56] References Cited

U.S. PATENT DOCUMENTS

| | | | |
|---|---|---|---|
| 4,782,444 | 11/1988 | Munshi et al. | 395/709 |
| 5,085,325 | 2/1992 | Jones et al. | 209/580 |
| 5,221,959 | 6/1993 | Ohyama et al. | 356/326 |
| 5,249,295 | 9/1993 | Briggs et al. | 395/709 |
| 5,751,450 | 5/1998 | Robinson | 358/504 |

OTHER PUBLICATIONS

Briggs et al., "Improvements to graph coloring register allocation", ACM Trans. Prog. Langu. & Sys., vol. 16, No. 3. pp. 428–455, May 1994.

Winner et al., "Hardware acelerated rendering of antialiasing using a modified a buffer algorithm", SIGGRAPH, ACM, pp. 307–316, 1997.

Pinotti et al., "Conflict free templete access in K ary and binomial tree", ICS, ACM, pp. 237–244, May 1997.

"Computer Algorithms", by Sara Baase, Addison–Wesley Publishing Company, 1990, pp. 346–355.

*Primary Examiner*—Tariq R. Hafiz
*Assistant Examiner*—Anil Khatri

[57] ABSTRACT

A method for minimizing the number of input terminals used in an operator includes generating a conflict graph having nodes with regard to an output path of data to be processed by the operator, coloring the nodes so that no two nodes directly connected to each other have the same color, and selectively inputting data from the nodes with a first color to a first input terminal of the operator and selectively inputting data from the nodes with a second color to a second input terminal of the operator.

14 Claims, 4 Drawing Sheets

| CONTROL STEP | DATA |
|:---:|:---:|
| 1 | D1 + D2 |
| 2 | D1 + D3 |
| 3 | D4 + D1 |
| 4 | D2 + D1 |

| CONTROL STEP | DATA |
| --- | --- |
| 1 | D1 + D2 |
| 2 | D1 + D3 |
| 3 | D4 + D1 |
| 4 | D3 + D4 |

METHOD FOR MINIMIZING THE NUMBER OF INPUT TERMINALS USED IN AN OPERATOR

BACKGROUND OF THE INVENTION

1. Field of the Invention

The present invention relates to a method for decreasing the number of input terminals used in an operator that employs an exchange principle, and more particularly to an improved method for minimizing the number of input terminals used in an operator/operand by employing a graph coloring algorithm.

2. Description of the Related Art

In recent years, semiconductor devices have been widely applied to a variety of industrial fields including the information communication field. With significantly enhanced semiconductor device fabrication techniques, chip integration is being further improved. However, there still remain a few problems to be solved in order to achieve larger scaled integration.

One of the unsolved problems in the conventional semiconductor device fabrication techniques is providing an effective method for decreasing the number of input terminals or wirings used in different operators, e.g., logic gates.

With reference to FIGS. 1 and 2, a conventional method for designing an input wirework of an algorithm-performing operator will now be described.

In the conventional method, an adder is required to process a plurality of data values outputted from data sources different from each other as shown in FIG. 1. With regard to a plurality of control steps that are also different from each other, a hardware composition according to the conventional art as shown in FIG. 2 employs a 3×1 multiplexer 1 for receiving data values D1, D2 and D4, a 3×1 multiplexer 2 for receiving data values D1, D2 and D3, and an adder 3 for receiving the output from each multiplexer 1 and 2 to generate output data DO. However, in such an operator according to the conventional art, an adoption of an exchange principle is not considered in the interconnection design, and thus a larger number of input terminals (i.e., 6 input terminals of the multiplexers 1 and 2) are needed.

Further, although the number of input terminals used in the operator may be decreased by exchanging data pairs, this decreasing operation according to the conventional art is limited to a partial reduction of the input terminals, so there still exists a difficult problem to be solved to efficiently realize a larger scaled integration with regard to operator input terminals.

SUMMARY OF THE INVENTION

Accordingly, it is an object of the present invention to provide an operator input terminal decreasing method, wherein a data transmission path decreases the number of input terminals used in an operator that employs an exchange principle, so as to minimize the number of multiplexer input terminals needed in the operator having a higher covalence characteristic by employing a graph coloring algorithm.

To achieve the above-described and other objects, there is provided a method for minimizing the number of input terminals used in an operator, comprising the steps of generating a conflict graph having nodes with regard to an output path of data to be processed by the operator; coloring the nodes so that no two nodes directly connected to each other have the same color; and selectively inputting data from nodes with a first color to a first input terminal of the operator and selectively inputting data from nodes with a second color to a second input terminal of the operator.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed descriptions.

BRIEF DESCRIPTION OF THE DRAWINGS

The present invention will become more clearly understood with reference to the accompanying drawings given only by way of illustrations and thus not limited to the present invention, wherein.

DETAILED DESCRIPTION OF THE PREFERRED EMBODIMENTS

Figures 5, 6:
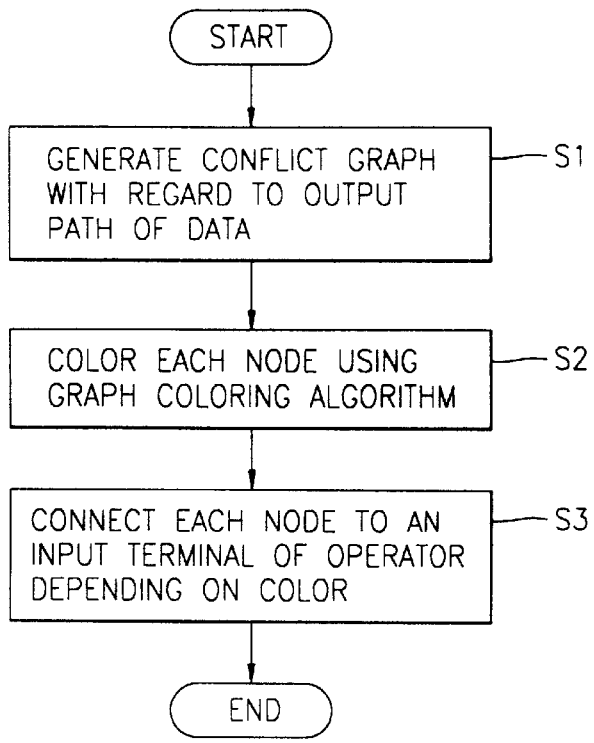
FIG. 5 is a flow chart illustrating a method for minimizing the number of input terminals used in an operator that adapts an exchange principle according to the present invention.
FIG. 6 is a table illustrating another example of control steps requiring addition of data values outputted from a variety of data sources according to the present invention.

With reference to the accompanying drawings, the method for minimizing the number of input terminals used in an operator (e.g., a logic gate) that adapts an exchange principle according to the present invention includes as shown in FIG. 5: a first step S1 for generating a conflict graph with regard to an output path of data values to be processed in the operator, a second step S2 for coloring each of the nodes in the conflict graph, appropriately connected to each other based on the operation to be performed, with a color according to a known graph coloring algorithm so that any two nodes connected to each other are colored with different colors, and a third step S3 for connecting a first set of nodes with a first color to a first input terminal of the operator, and a second set of nodes with a second color to a second input terminal of the operator. Any other nodes with a third color different from the first and second colors are commonly connected to the first and second terminals of the operator.

Figures 1, 2:
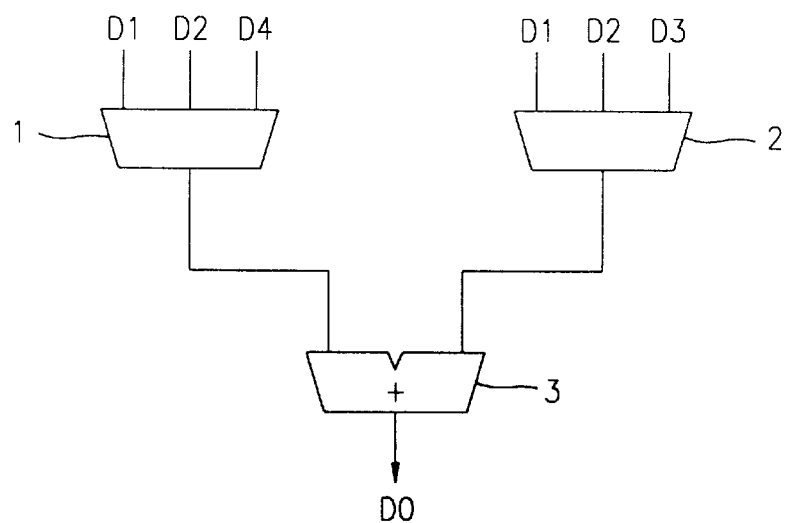
FIG. 1 is a table illustrating control steps requiring addition of data values outputted from a variety of data sources according to a conventional hardware composition method.
FIG. 2 is an interconnection design view with regard to FIG. 1 according to a conventional art.
Figure 3:
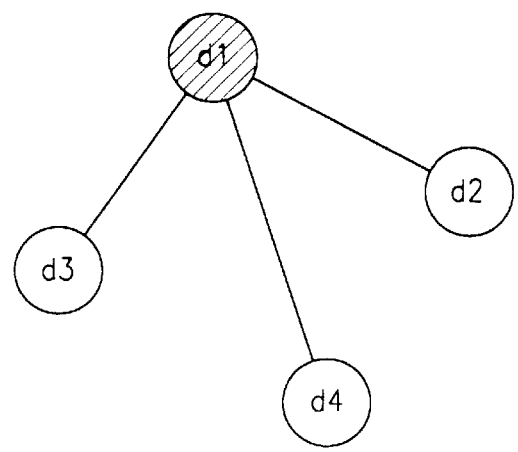
FIG. 3 is a view illustrating a graph coloring result of FIG. 1 with regard to a conflict graph according to the present invention.

Referring to FIGS. 1, 3 and 5, the operation according to the present invention will now be described.

First, in the first step S1, an output path of data being processed is represented by a conflict graph. At this time, each of the data serves as a node and the data existing in the same control step exists in a corresponding one of the input terminals, so that the nodes are connected based on the desired operation of the data.

FIG. 3 is a conflict graph produced based on the control step shown in the table of FIG. 1 according to the present invention, wherein a slashed node (data) d1 denotes a first color, and other nodes d2, d3, d4 respectively denote a second color different from the first color.

In the second step S2, when the conflict graph composition is completed as described above, the nodes of the conflict graph are colored using the first and second colors according to a well-known graph coloring algorithm. The first and second colors respectively denote left and right operands. An example of a well-known graph coloring algorithm used in the second step S2 is described in an article entitled "Computer Algorithm", written by Sara Baase, Addison-Wesley Publishing Company, pp 351–353, 1990, which describes that two nodes connected by an edge to each other are colored by a minimal number of different colors.

After completing the coloring step S2, a node d1 colored with the first color is connected to a first input terminal of an operator, and the other nodes d2, d3 and d4 represented with the second color are connected to a second input terminal of the operator in the third step S3. Based on these connections, the operator performs its predetermined operation and outputs an output data dO.

Figure 4:
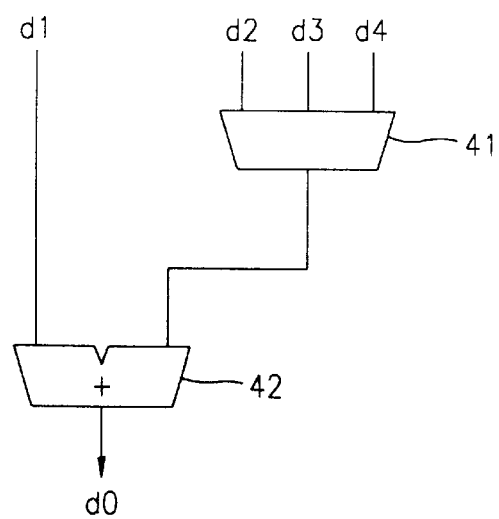
FIG. 4 is an interconnection design view with regard to FIG. 3 according to the present invention.

FIG. 4 illustrates a hardware example realizing the steps S1-S3 of FIG. 5. As shown therein, a node (data) d1 expressed with the first color is directly connected to a first input terminal of an operator, e.g., an adder 42. And, since three nodes (data) d2, d3, d4 have the same second color, the nodes d2–d4 are indirectly connected to a second input terminal of the operator via a 3×1 multiplexer 41.

Figure 7:
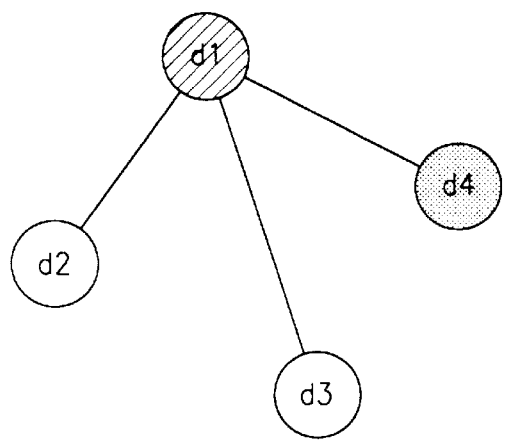
FIG. 7 is a view illustrating a graph coloring result of FIG. 6 with regard to a conflict graph according to the present invention.
Figure 8:
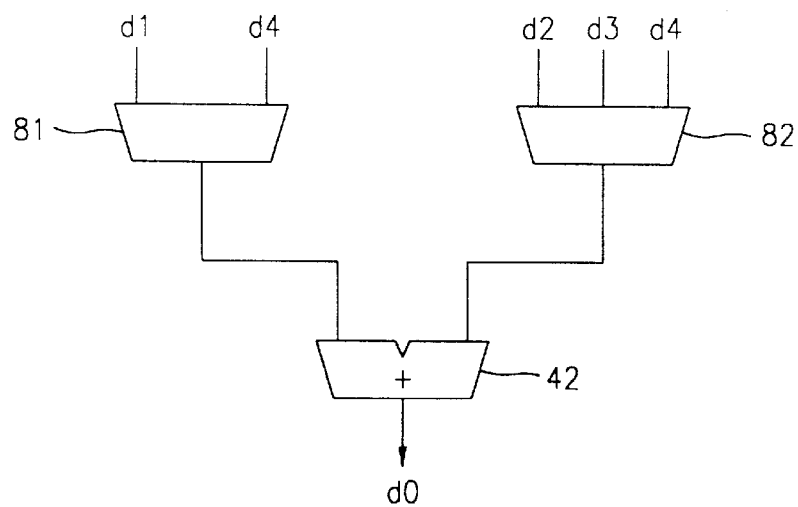
FIG. 8 is an interconnection design view with regard to FIG. 7 according to the present invention.

In another example, if the color of the node d4 is allocated with a color different from the first and second colors because the control step 4 as shown in FIG. 6 is required, then a conflict graph with three different colors as shown in FIG. 7 is generated. According to the coloring scheme and similar to the example shown in FIG. 4, the node d1 with the first color is connected to a first multiplexer 81, and the nodes d2 and d3 with the second color are connected to a second multiplexer 82. In addition, the node d4 with a third color is connected to both the first and second multiplexers 81 and 82. That is, the node d4 is commonly connected to the first and second input terminals of the adder 41 that generates an output data dO.

As described above, the present invention employs a graph coloring algorithm applied to an operator electronics with regard to higher covalence, for thereby minimizing the number of input terminals of any multiplexer in the operator needed to implement control steps using the operator and further realizing a larger integration for the operator.

According to the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for minimizing the number of input terminals used in an operator, comprising:

generating a conflict graph having nodes with regard to an output path of data to be processed by the operator;

selectively coloring the nodes with first and second colors, so that no two nodes directly connected to each other have the same color; and selectively inputting data from the nodes with a first color to a first input terminal of the operator and data from the nodes with a second color to a second input terminal of the operator.

2. The method of claim 1, wherein in the generating step, first and second nodes are directly connected to each other by an edge a control step.

3. The method of claim 1, wherein the coloring step is performed according to a graph coloring algorithm.

4. The method of claim 1, wherein in the selectively inputting step, when a third color other than the first and second colors is allocated to at least one node, the at least one node is commonly connected to the first and second input terminals of the operator.

5. The method of claim 1, further comprising:

coloring a third node, which is directly connected to both a first node with the first color and a second node with the second color, with a third color.

6. The method of claim 5, further comprising:

selectively inputting data from the third node to both the first and second input terminals of the operator.

7. The method of claim 1, wherein the selectively inputting step directly inputs the data from the nodes with the first color to at least one input terminal of a first multiplexer in the operator.

8. The method of claim 7, wherein the selectively inputting step directly inputs the data from the nodes with the second color to at least one input terminal of a second multiplexer in the operator.

9. The method of claim 8, further comprising:

coloring a third node, which is directly connected to one of the nodes with the first color and one of the nodes with the second color, with a third color.

10. The method of claim 9, further comprising:

selectively inputting data from the third node to both the first and second input terminals of the operator.

11. The method of claim 10, wherein the step of selectively inputting the data from the third node directly inputs the data from the third node to both the at least one input terminal of the first multiplexer and the at least one input terminal of the second multiplexer.

12. The method of claim 8, wherein the operator performs addition.

13. The method of claim 8, wherein outputs of the first and second multiplexers are directly input to an adder of the operator.

14. The method of claim 1, wherein the operator performs one of addition, subtraction, multiplication and division.

* * * * *